(12) United States Patent
Yuan et al.

(10) Patent No.: US 10,147,704 B2
(45) Date of Patent: Dec. 4, 2018

(54) SEMICONDUCTOR DEVICES AND METHODS OF MANUFACTURING THEREOF

(71) Applicant: Taiwan Semiconductor Manufacturing Company, Ltd., Hsin-Chu (TW)

(72) Inventors: Ching-Pin Yuan, Taichung (TW); Chen-Hua Yu, Hsin-Chu (TW); Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 15/157,302

(22) Filed: May 17, 2016

(65) Prior Publication Data

US 2017/0338203 A1    Nov. 23, 2017

(51) Int. Cl.

| H01L 25/065 | (2006.01) |
|---|---|
| H01L 25/00 | (2006.01) |
| H01L 23/48 | (2006.01) |
| H01L 23/522 | (2006.01) |
| H01L 23/532 | (2006.01) |
| H01L 23/60 | (2006.01) |

(52) U.S. Cl.
CPC ........ *H01L 25/0657* (2013.01); *H01L 23/481* (2013.01); *H01L 23/5225* (2013.01); *H01L 23/53295* (2013.01); *H01L 23/60* (2013.01); *H01L 25/50* (2013.01); *H01L 2225/06527* (2013.01); *H01L 2225/06537* (2013.01); *H01L 2225/06544* (2013.01)

(58) Field of Classification Search
CPC .................................................. H01L 25/0657
See application file for complete search history.

(56) References Cited

U.S. PATENT DOCUMENTS

| 7,564,115 | B2 | 7/2009 | Chen et al. |
|---|---|---|---|
| 7,633,165 | B2 | 12/2009 | Hsu et al. |
| 7,825,024 | B2 | 11/2010 | Lin et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |
| 8,183,579 | B2 | 5/2012 | Wang |
| 8,227,902 | B2 | 7/2012 | Kuo |
| 8,278,152 | B2 | 10/2012 | Liu et al. |
| 8,426,961 | B2 | 4/2013 | Shih et al. |
| 8,669,174 | B2 | 3/2014 | Wu et al. |
| 8,802,504 | B1 | 8/2014 | Hou et al. |
| 8,803,292 | B2 | 8/2014 | Chen et al. |
| 8,803,316 | B2 | 8/2014 | Lin et al. |
| 2009/0283871 | A1* | 11/2009 | Chang ............... H01L 21/76898 257/621 |

(Continued)

*Primary Examiner* — Mounir Amer
(74) *Attorney, Agent, or Firm* — Slater Matsil, LLP

(57) ABSTRACT

Semiconductor devices and methods of manufacture thereof are disclosed. In some embodiments, a semiconductor device includes a first integrated circuit die, a second integrated circuit die coupled to the first integrated circuit die, and a through-via coupled between a first conductive feature of the first integrated circuit die and second conductive feature of the second integrated circuit die. A conductive shield is disposed around a portion of the through-via.

20 Claims, 16 Drawing Sheets

(56) References Cited

U.S. PATENT DOCUMENTS

| | | | |
|---|---|---|---|
| 2009/0309180 A1* | 12/2009 | Yamagata | G06K 9/0002 257/435 |
| 2014/0001645 A1 | 1/2014 | Lin et al. | |
| 2014/0070316 A1* | 3/2014 | Chan | H01L 21/823412 257/347 |
| 2014/0199834 A1* | 7/2014 | Gu | H01L 23/5286 438/667 |
| 2014/0225258 A1 | 8/2014 | Chiu et al. | |
| 2014/0252572 A1 | 9/2014 | Hou et al. | |
| 2015/0021771 A1* | 1/2015 | Lin | H01L 21/76898 257/751 |
| 2015/0021784 A1* | 1/2015 | Lin | H01L 23/481 257/774 |
| 2015/0021789 A1* | 1/2015 | Lin | H01L 23/481 257/774 |
| 2015/0287697 A1 | 10/2015 | Tsai et al. | |
| 2015/0348872 A1 | 12/2015 | Kuo et al. | |
| 2016/0079166 A1* | 3/2016 | Farooq | H01L 23/5256 257/529 |

* cited by examiner

SEMICONDUCTOR DEVICES AND METHODS OF MANUFACTURING THEREOF

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. As the demand for miniaturization, higher speed and greater bandwidth, as well as lower power consumption and latency has grown recently, there has grown a need for smaller and more creative packaging techniques for semiconductor dies.

As semiconductor technologies further advance, stacked semiconductor devices, e.g., three-dimensional integrated circuits (3DICs), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed or stacked on top of one another to further reduce the form factor of the semiconductor device.

Two semiconductor wafers and/or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
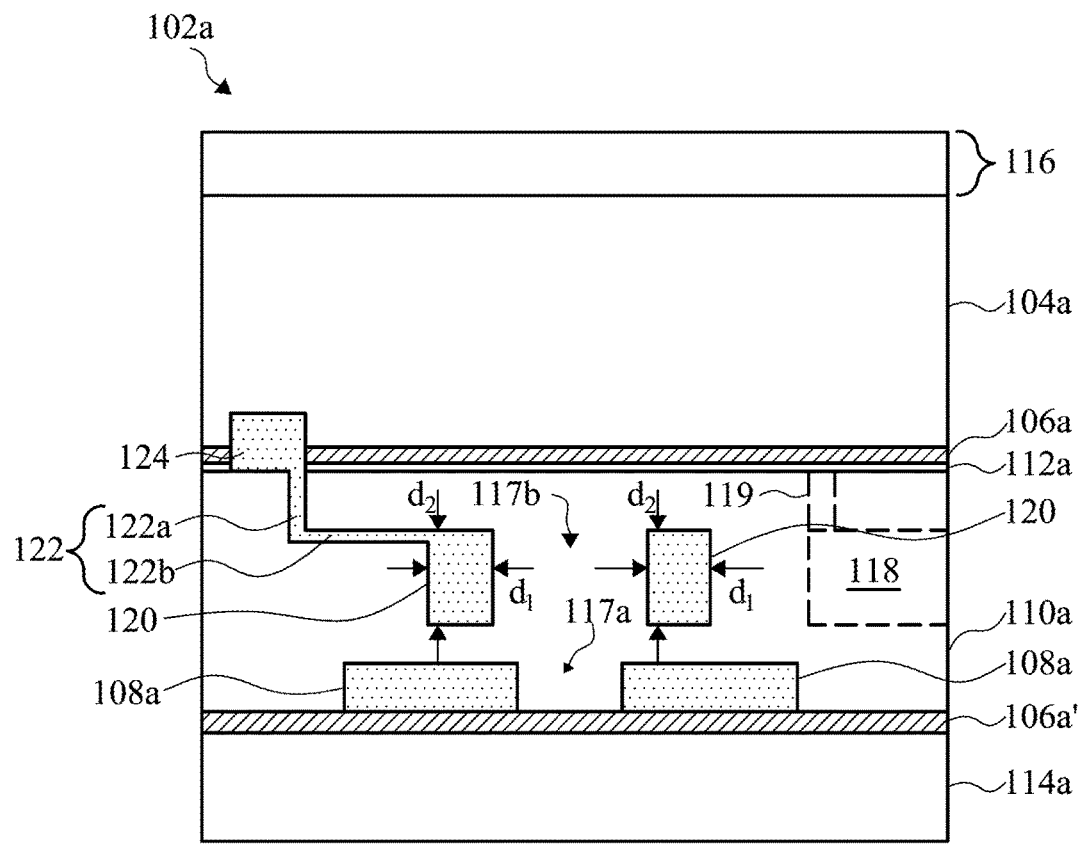
FIGS. 1 and 2 are cross-sectional views of semiconductor devices that are bonded together in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of manufacturing semiconductor devices and structures thereof are disclosed in the present disclosure. Semiconductor devices such as integrated circuit dies and/or semiconductor wafers are coupled and/or bonded together, forming 3DICs in some embodiments. Through-vias are formed in the bonded semiconductor devices that provide vertical electrical connections for the 3DICs. The through-vias are protected by a conductive shield that encircles at least a portion of the through-vias. The conductive shield is coupled to a substrate of one of the integrated circuit dies and/or wafers in some embodiments. The conductive shield provides a grounding electrical path to the substrate and provides electrostatic discharge (ESD) protection in some embodiments. Throughout the various views and illustrative embodiments, like reference numerals are used to designate like elements.

Figure 2:
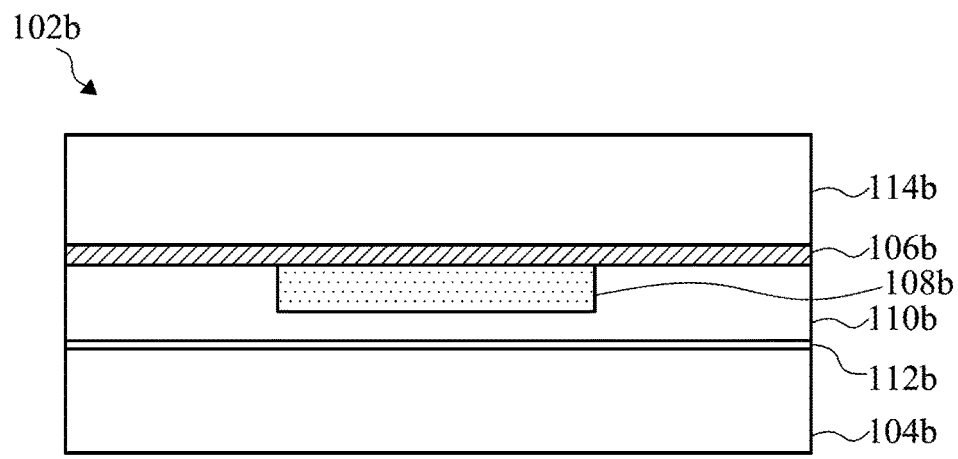

FIGS. 1 and 2 are cross-sectional views of first and second semiconductor devices 102a and 102b, respectively, which are bonded together in accordance with some embodiments of the present disclosure. Referring first to FIG. 1, a first semiconductor device 102a is provided. The first semiconductor device 102a comprises an integrated circuit die or a semiconductor wafer that includes a plurality of integrated circuit dies in some embodiments. A plurality of the first semiconductor devices 102a comprising integrated circuit dies that have been singulated from wafer form may also be provided.

The first semiconductor device 102a includes a substrate 104a. The substrate 104a is also referred to herein as a first substrate. The substrate 104a may comprise a silicon wafer, a silicon carbon substrate, a silicon germanium substrate, or a substrate formed of other semiconductor materials, a bulk substrate, a silicon-on-wafer (SOI) substrate, or other supporting substrate (i.e., quartz, glass, etc., as are known in the art), or combinations thereof. The substrate 104a may include one or more insulating materials 116 disposed on a surface thereof, e.g., over the top surface in the view shown in FIG. 1. The insulating material 116 may comprise one or more layers of $SiO_2$ or other insulating materials.

The substrate 104a comprises circuitry 112a that includes active device layer(s) formed over and/or within the substrate 104a in a front-end-of-line (FEOL) stage of a manufacturing process or other type of process in some embodiments, for example. The first semiconductor device 102a is inverted in the view shown in the drawings; typically, the circuitry 112a is formed over a top surface of the substrate 104a. For example, the circuitry 112a is illustrated disposed beneath a lower portion of the substrate 104a of the first semiconductor device 102a in the view shown in FIG. 1.

The circuitry 112a may comprise any type of circuitry suitable for a particular application. The circuitry 112a may comprise one or more electrical or electronic devices. For example, the circuitry 112a may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions of the circuitry 112a may include memory structures, logic structures, processing structures, sensors, amplifiers, power distribution or management, input/output circuitry, active or passive devices, radio frequency (RF) devices, analog or digital devices, and/or the like. One of ordinary skill in the art will appreciate that the above examples are provided for illustrative purposes to further explain applications of some illustrative embodiments and are not meant to limit the disclosure in any manner. The first semiconductor device 102a may also comprise other circuitry 112a as appropriate for a given application.

In some embodiments, a passivation layer 106a is disposed over the substrate 104a (i.e., beneath the substrate 104a in the inverted view shown in FIG. 1) before the formation of the circuitry 112a. The passivation layer 106a may comprise one or more insulating material layers, such as $SiO_2$, SiN, or the like. In some embodiments, the passivation layer 106a may comprise a first layer of $SiO_2$ comprising a thickness of about 2,000 Angstroms to about 12,000 Angstroms, a layer of SiN comprising a thickness of about 500 Angstroms to about 1,000 Angstroms disposed over the first layer of $SiO_2$, and a second layer of $SiO_2$ comprising a thickness of about 2,000 Angstroms to about 12,000 Angstroms disposed over the layer of SiN, as an example. The $SiO_2$ layers and SiN layer may be formed using chemical vapor deposition (CVD) or other methods, for example. The passivation layer 106a may also comprise other materials and dimensions. In some embodiments, the passivation layer 106a is not included, and the circuitry 112a is formed directly over and/or within the substrate 104a.

An interconnect structure is formed over the substrate 104a, e.g., over the circuitry 112a (i.e., beneath the substrate 104a in the inverted view shown in FIG. 1). The interconnect structure may be formed in a back-end-of-line (BEOL) stage of a manufacturing process, for example. The interconnect structure comprises a plurality of conductive features 108a, a plurality of conductive lines 118 (shown in phantom, e.g., in dashed lines in FIG. 1), and/or a plurality of conductive vias 119 (also shown in phantom in FIG. 1) disposed within a plurality of insulating material layers 110a. The interconnect structure may comprise inter-layer dielectrics (ILD), inter-metallization dielectric (IMD) layers, or inter-metal layers, as examples. For example, the plurality of insulating material layers 110a may be formed of a low-K dielectric material, such as phosphosilicate glass (PSG), borophosphosilicate glass (BPSG), fluorosilicate glass (FSG), $SiO_xC_y$, undoped silicate glass (USG), spin-on-glass, spin-on-polymers, silicon carbon material, compounds thereof, composites thereof, other materials, combinations or multiple layers thereof, or the like, formed using any suitable methods known in the art, such as spinning, CVD, and plasma-enhanced CVD (PECVD).

The plurality of conductive features 108a, plurality of conductive lines 118, and/or plurality of conductive vias 119 of the interconnect structure connect various circuitry 112a such as passive and active components formed in and on the substrate 104a to one another and to external components. The interconnect structure may include, for instance, one or more layers of conductive traces vertically interconnected by vias (not shown) embedded within dielectric layers that are formed using damascene processes or subtractive etch techniques. The interconnect structure including the plurality of conductive features 108a, plurality of conductive lines 118, and/or plurality of conductive vias 119 and the plurality of insulating material layers 110a may comprise an overall thickness of about 1 μm to about 10 μm, for example. The interconnect structure may also comprise other dimensions.

Regardless of the number of layers of the interconnect structure, the first semiconductor device 102a includes a top interconnect layer that includes conductive features 108a. The plurality of conductive features 108a, plurality of conductive lines 118, and/or plurality of conductive vias 119 may comprise conductive lines, traces, or plugs that comprise a conductive material such as copper, a copper alloy, or other metals or conductive materials. The conductive feature 108a illustrated in FIG. 1 includes an opening 117a in a substantially central region thereof in some embodiments. The conductive feature 108a may be connected to other components or elements of the first semiconductor device 102a by wiring within the interconnect structure, not shown. One conductive feature 108a is illustrated in FIG. 1 and FIGS. 3 through 15; however, the first semiconductor device 102a may comprise numerous conductive features 108a in the top interconnect layer. The conductive features 108a are also referred to herein as first conductive features.

A passivation layer 106a' comprising similar materials and dimensions as described for passivation layer 106a is formed over (i.e., beneath in the view shown in FIG. 1) the plurality of conductive features 108a in the top interconnect layer in some embodiments. In some embodiments, a passivation layer 106' is not included.

The first semiconductor device 102a includes an insulating material layer 114a formed over (i.e., beneath in the view shown in FIG. 1) the passivation layer 106a', or over the plurality of conductive features 108a in the top interconnect layer in some embodiments wherein the passivation layer 106a' is not included. The insulating material layer 114a comprises a buried oxide (BOX) layer in some embodiments. The insulating material layer 114a is also referred to herein as a first insulating material layer. The insulating material layer 114a may comprise $SiO_2$ formed by CVD in some embodiments, for example. The insulating material layer 114a may comprise a thickness of about 0.2 μm to about 3 μm, for example. The insulating material layer 114a may also comprise other materials, dimensions, and formation methods.

In accordance with some embodiments of the present disclosure, a conductive shield 120 is disposed within the interconnect structure. The conductive shield 120 comprises a substantially ring-like shape in a top or bottom view of the first semiconductor device 102a in some embodiments. The conductive shield 120 may also comprise other shapes. The conductive shield 120 includes an opening 117b formed therein. The opening 117b in the conductive shield 120 is also referred to herein as a first opening, and the opening 117a in the conductive feature 108a is also referred to herein as a second opening in some embodiments.

The conductive shield 120 is connected to the substrate 104a of the first semiconductor device 102a by wiring 122 within the insulating material layers 110a of the interconnect structure. For example, wiring 122 including conductive lines 122b and conductive vias 122a may be coupled between the conductive shield 120 and a terminal 124 comprising a conductive material that is coupled to the substrate 104a, in some embodiments. The terminal 124 may comprise a contact pad, conductive via, or conductive or semiconductive material plug in some embodiments, for example. The terminal 124 coupled to the substrate 104a may also comprise other types of connections and materials.

The conductive shield 120 is advantageously formed in a conductive line 118 layer or a conductive via 119 layer of the interconnect structure. The pattern for the conductive shield 120 may be included in an existing lithography mask used for patterning a conductive line 118 layer or a conductive via 119 layer, for example. Likewise, the wiring 122 coupling the conductive shield 120 to the substrate 104 may also be included in conductive line 118 layers or conductive via 119 layers of the interconnect structure. Therefore, additional material layers and processing steps are not required to include the conductive shield 120 and wiring 122 in the first semiconductor device 102a. The conductive shield 120 and wiring 122 comprise the same materials as the conductive lines 118, conductive vias 119, or conductive feature 108a, such as copper, a copper alloy, or other metals or conductive materials, in some embodiments.

A portion of the conductive shield 120 may comprise a width comprising dimension $d_1$ on each side, wherein dimension $d_1$ comprises about 0.5 μm to about 3 μm in some embodiments. For example, the width of the portion of the conductive shield 120 comprising dimension $d_1$ on each side may comprise about 1.5 μm in some embodiments. The conductive shield 120 may comprise a thickness comprising dimension $d_2$ in some embodiments, wherein dimension $d_2$ comprises about 0.5 μm to about 3 μm in some embodiments. Dimensions $d_1$ and $d_2$ of the conductive shield 120 may also comprise other dimensions. Dimensions $d_1$ and $d_2$ of the conductive shield 120 are of a sufficient size so that the conductive shield 120 provides adequate ESD protection and/or plasma-induced damage (PID) protection for a subsequently formed through-via 150 (not shown in FIG. 1; see through-via 150 shown in FIG. 15) in some embodiments, for example.

Referring next to FIG. 2, a second semiconductor device 102b is provided. The second semiconductor device 102b comprises an integrated circuit die or a semiconductor wafer that includes a plurality of integrated circuit dies in some embodiments. A plurality of the second semiconductor devices 102b that comprise integrated circuit dies that have been singulated from wafer form may also be provided. The second semiconductor device 102b includes similar elements as described for first semiconductor device 102a, and like numerals are used. Thus, the elements described for the first semiconductor device 102a may be referred to for more detailed descriptions of the elements of the second semiconductor device 102b.

The second semiconductor device 102b includes a substrate 104b which is also referred to herein as a second substrate. Circuitry 112b is formed over or within the substrate 104b, and an interconnect structure including insulating material layers 110b and conductive features 108b formed therein is formed over the circuitry 112b. The conductive feature 108b illustrated in FIG. 2 is also referred to herein as a first conductive feature. The interconnect structure may also include conductive line layers and conductive vias, as described for the interconnect structure of the first semiconductor device 102a. A passivation layer 106b may be formed over the interconnect structure, and an insulating material layer 114b which may comprise a BOX layer is formed over the passivation layer 106b. The insulating material layer 114b is also referred to herein as a second insulating material layer. The passivation layer 106b may not be included in some embodiments.

The interconnect structure of the second semiconductor device 102b includes a top or uppermost interconnect layer that includes the conductive feature 108b shown. The second semiconductor device 102b may be, but need not necessarily be, the same type of device as the first semiconductor device 102a, and the second semiconductor device 102b may be manufactured using similar processes and may include similar structures and materials as the first semiconductor device 102a. The second semiconductor device 102b may also comprise a different type of device than the first semiconductor device 102a, and the second semiconductor device 102b may be manufactured using different processes, structures and materials.

Figure 3:
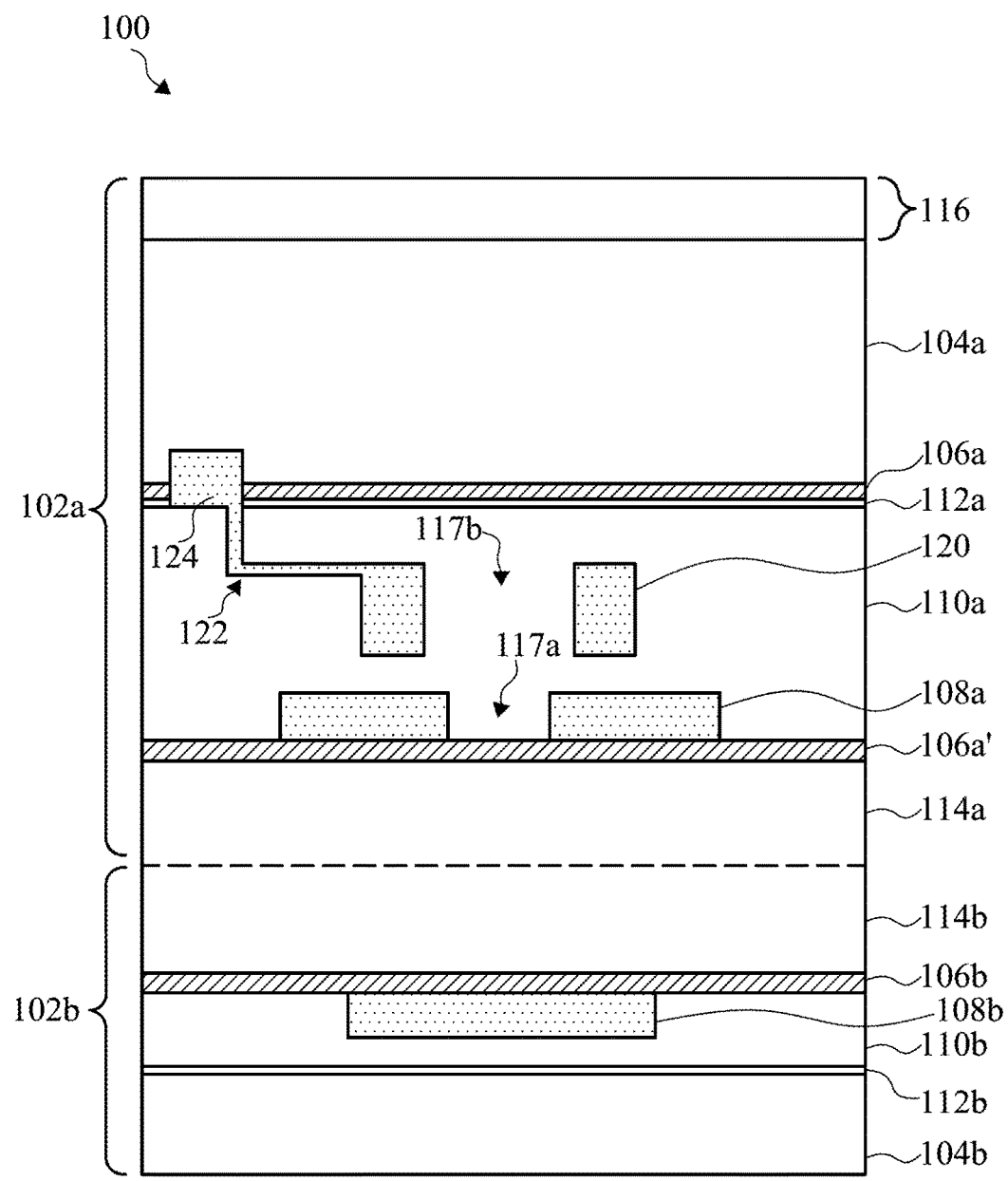
FIGS. 3 through 7 and 10 through 15 illustrate cross-sectional views of a manufacturing process at various stages wherein the semiconductor devices shown in FIGS. 1 and 2 are bonded together and through-vias are formed between conductive features of the two semiconductor devices in accordance with some embodiments.

FIGS. 3 through 7 and 10 through 15 are cross-sectional views that illustrate a manufacturing process at various stages, wherein the semiconductor devices 102a and 102b shown in FIGS. 1 and 2 are bonded together and through-vias 150 are formed between the semiconductor devices 102a and 102b in accordance with some embodiments. In FIG. 3, an inverted first semiconductor device 102a shown in FIG. 1 is coupled to a second semiconductor device 102b and is bonded to the second semiconductor device 102b. The first insulating material layer 114a of the first semiconductor device 102a is coupled to the second insulating material layer 114b of the second semiconductor device 102b using a glue or adhesive, or a dielectric-to-dielectric bond, such as an oxide-to-oxide bond. The first insulating material layer 114a of the first semiconductor device 102a may be coupled to the second insulating material layer 114b of the second semiconductor device 102b using fusion bonding, as an example. The first and second semiconductor devices 102a and 102b may also be bonded together using other methods.

The bonded first and second semiconductor devices 102a and 102b comprise a semiconductor device 100 that comprises a packaged semiconductor device or a 3DIC in some embodiments.

After the first and second semiconductor devices 102a and 102b are bonded together, vertical electrical connections between the first and second semiconductor devices 102a and 102b are formed. In some embodiments, a through-via 150 (see FIG. 15) is formed between each of the first conductive features 108a of the first semiconductor device 102a and a second conductive feature 108b of the second semiconductor device 102b, which will be shown and described further herein with reference to FIGS. 4 through 15.

Figure 4:
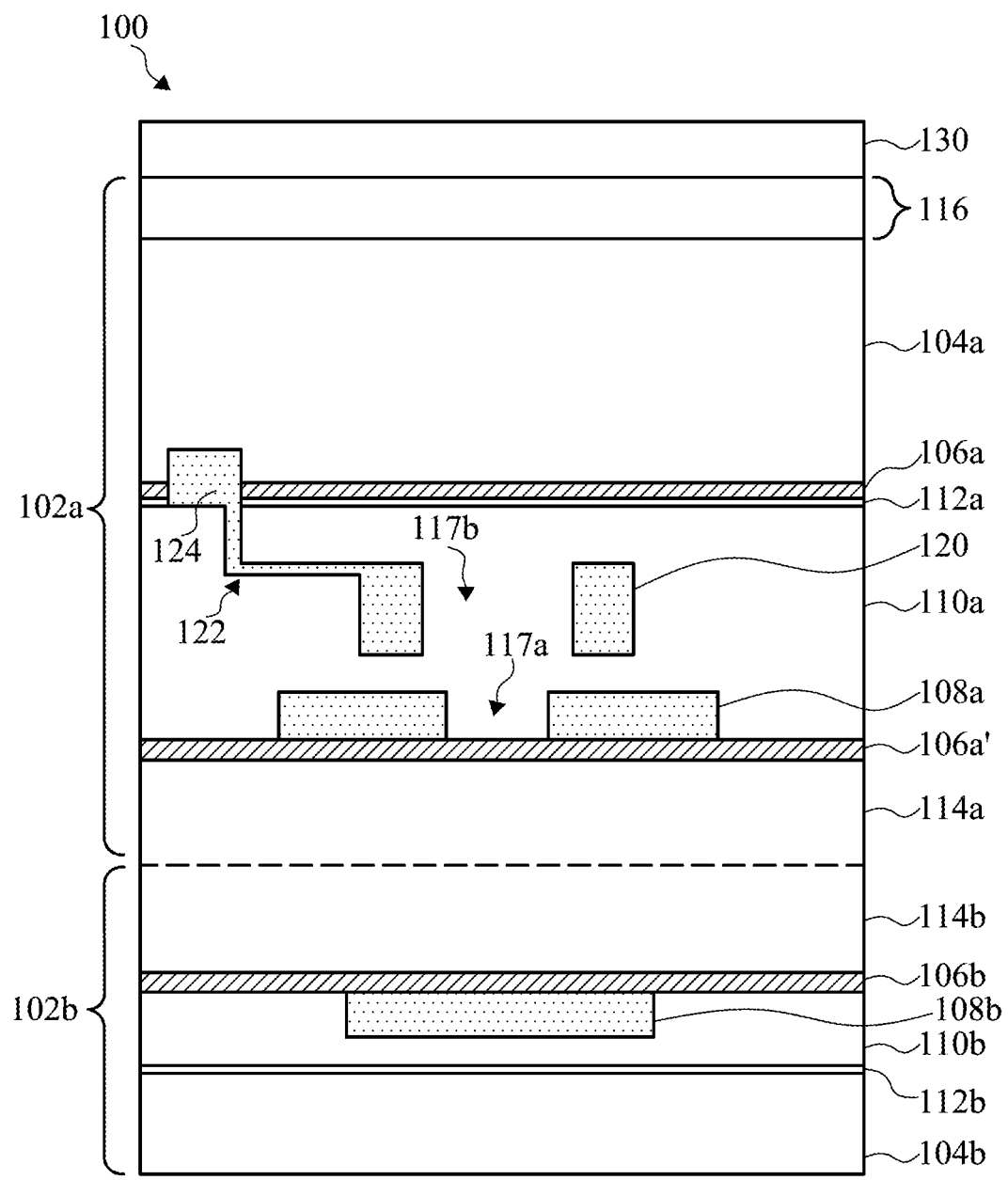
Figure 5:
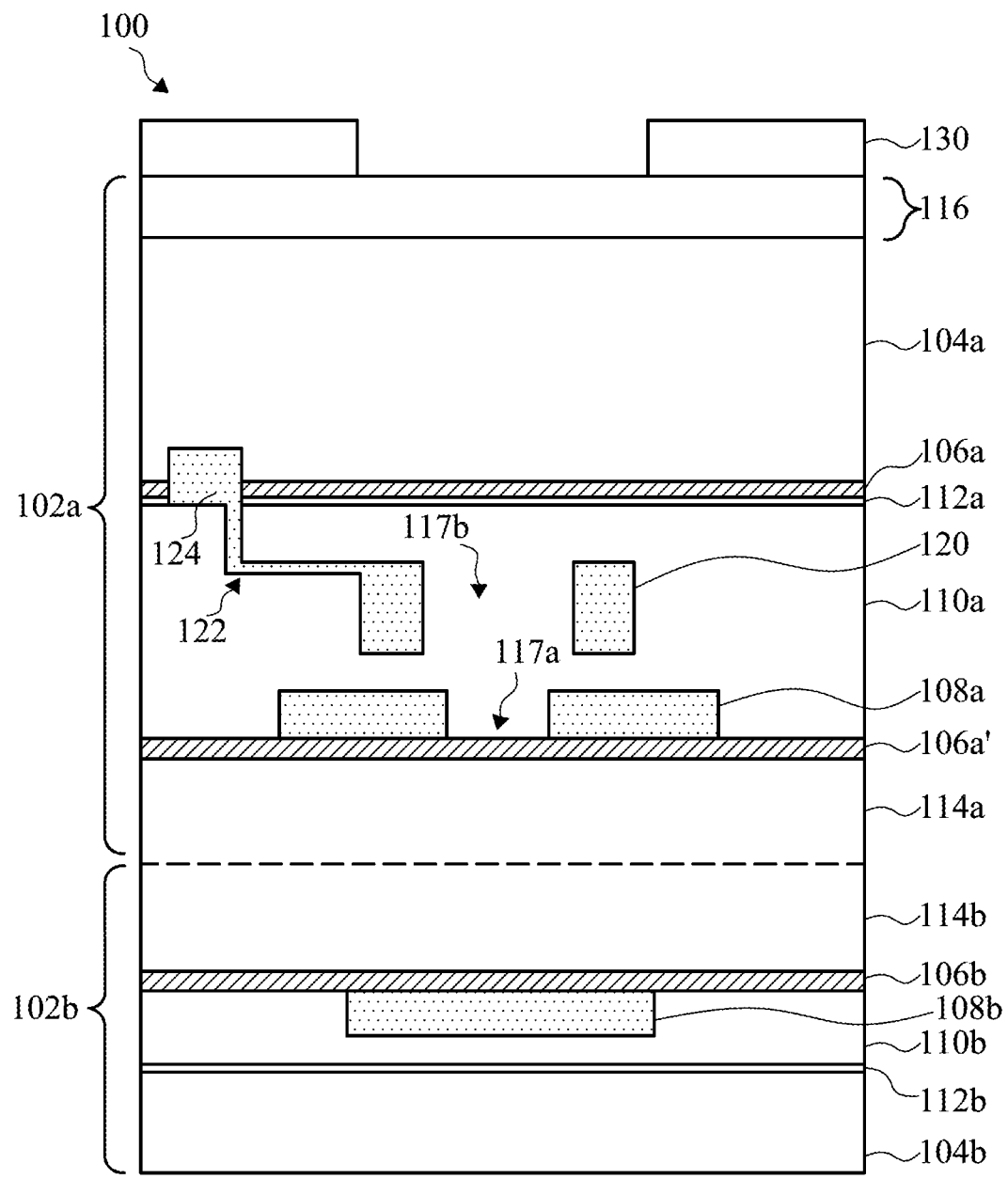

The first and second semiconductor devices 102a and 102b are patterned with a plurality of apertures for the through-vias 150 using a photolithography process or a direct patterning process. For example, to pattern the first and second semiconductor devices 102a and 102b using a photolithography process, a first layer of photoresist 130 is formed over the first semiconductor device 102a, e.g., over the insulating material 116 or over the substrate 104a of the first semiconductor device 102a in some embodiments wherein the insulating material 116 is not included, as shown in FIG. 4. The first layer of photoresist 130 is then patterned with a desired pattern for through-vias of the semiconductor device 100, as shown in FIG. 5. The first layer of photoresist 130 may be patterned by exposing the first layer of photoresist 130 to light or energy reflected from or through a lithography mask having a desired pattern thereon, developing the first layer of photoresist 130, and removing exposed or unexposed portions (depending on whether the first layer of photoresist 130 is positive or negative) of the first layer of photoresist 130 using an ashing and/or etching process. The patterns in the first layer of photoresist 130 may comprise a circular, oval, square, rectangular, or other shapes in a top view. The patterned first layer of photoresist 130 is then used as an etch mask while portions of the substrate 106 are removing using an etch process 132, forming apertures 136, as shown in FIG. 6.

The etch process 132 may comprise a plasma etch process in some embodiments. The conductive shield 120 advantageously protects the semiconductor device 100 from ESD and/or PID 134 during the etch process 132 by providing an electrical connection to the substrate 104a. The pattern of the first layer of photoresist 130 may be substantially the same size and shape as the conductive shield 120 in some embodiments. The pattern of the first layer of photoresist 130 may also comprise a width that is less than a width of the conductive shield 120 in some embodiments.

The etch process 132 results in the etching of insulating material 116, the substrate 104a, the passivation layer 106a, device layers of the circuitry 112a, and the insulating material layers 110a of the first semiconductor device 102a above the conductive shield 120 with the pattern of the first layer of photoresist 130 having a width comprising dimension $d_3$. The etch process 132 also results in the etching of the insulating material layers 110a within the opening 117b of the conductive shield 120 and the insulating material layers 110a below the conductive shield 120 and above the conductive feature 108a with a pattern of the opening 117a in the conductive shield 120 having a width comprising dimension $d_4$. The etch process 132 also results in the etching of the insulating material layers 114a and 114b and passivation layers 106a' and 106b with a pattern of the opening 117a of the conductive feature 108a having a width comprising dimension $d_5$. Dimensions $d_3$, $d_4$, and $d_5$ may comprise about 0.5 μm to about 10 μm in some embodiments, for example. Dimensions $d_3$, $d_4$, and $d_5$ may also comprise other values.

Figure 6:
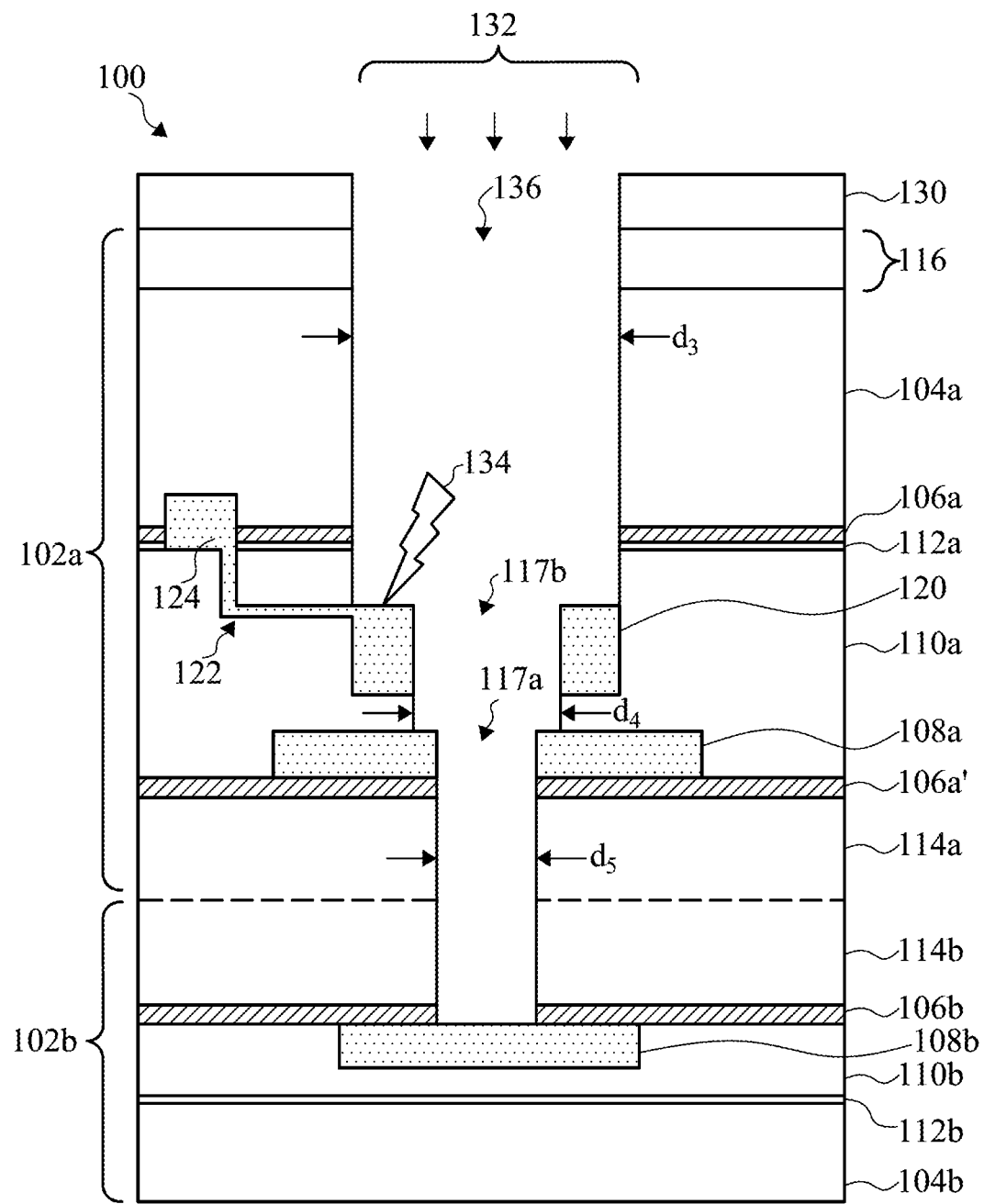

In some embodiments, dimension $d_3$ is greater than dimension $d_4$, and dimension $d_4$ is greater than dimension $d_5$, resulting in an aperture 136 having an inverted tiered shape, as illustrated in FIG. 6. The shape of the aperture 136 may vary depending on the size of the opening 117b in the conductive shield 120 and the opening 117a in the conductive feature 108a, for example. In some embodiments, dimensions $d_3$, $d_4$, and $d_5$ may be substantially the same, not shown.

Figure 7:
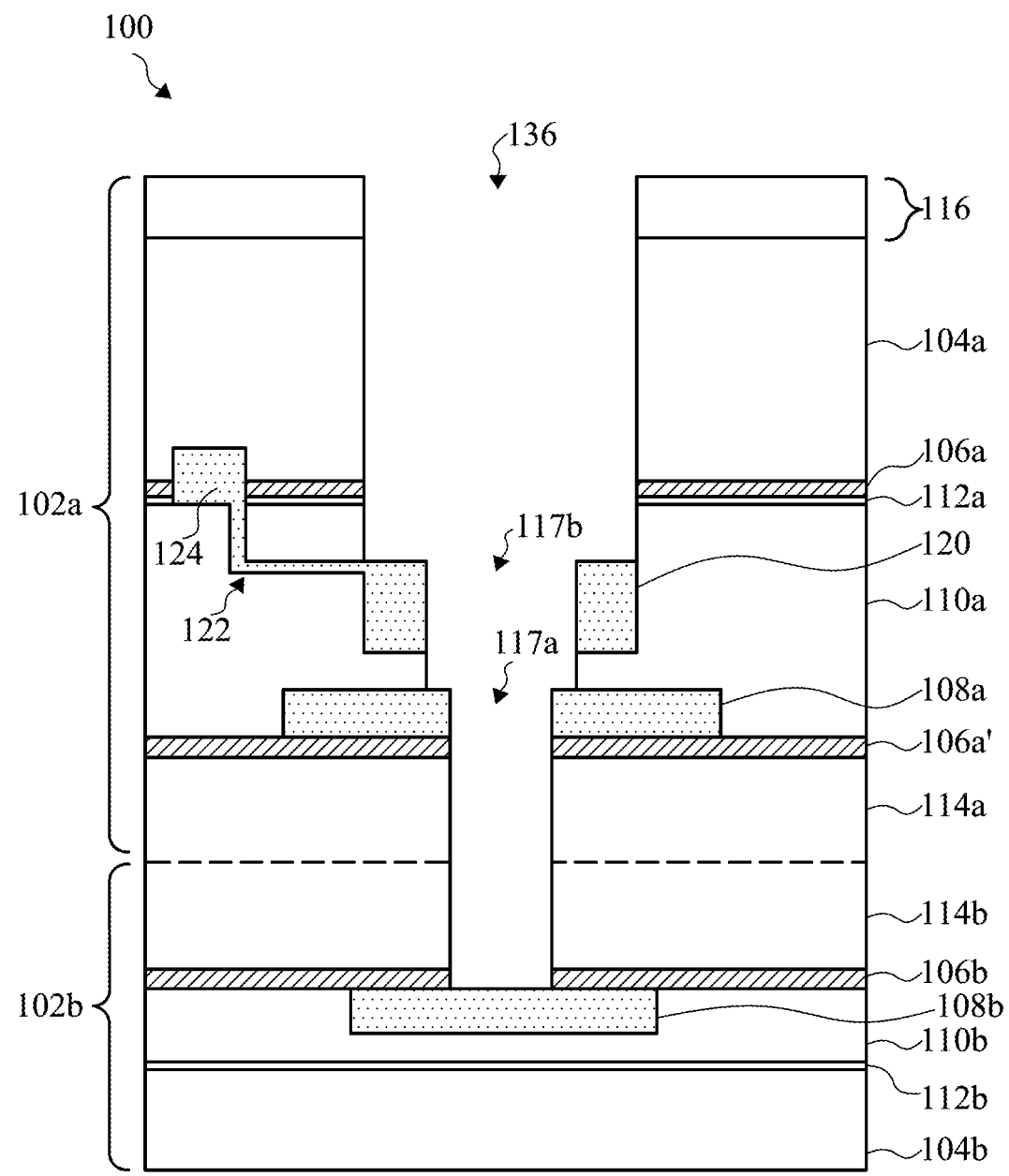

The first layer of photoresist 130 is then removed, as shown in FIG. 7.

Figure 8:
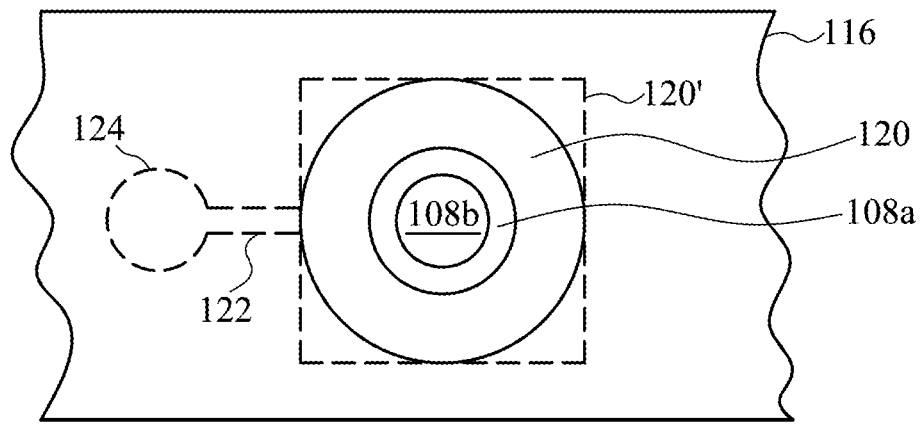
FIGS. 8 and 9 are top views of the semiconductor device shown in FIG. 7 in accordance with some embodiments.
Figure 9:
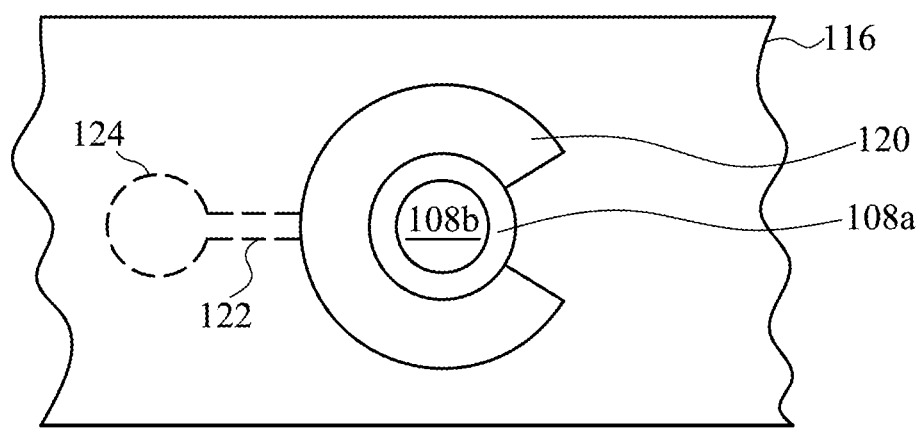

FIGS. 8 and 9 are top views of the semiconductor device 100 shown in FIG. 7 in accordance with some embodiments, which illustrate some exemplary shapes of the conductive shield 120 and other elements of the semiconductor device 100. In FIG. 8, the conductive shield 120 comprises a ring shape that is continuous. The ring shape of the conductive shield 120 may be circular or square, as illustrated in phantom at 120'. The ring shape of the conductive shield 120 may also comprise other shapes, such as oval, square, rectangular, or other shapes. In FIG. 8, the conductive shield 120 comprises a non-continuous ring shape. The conductive shield 120 partially or fully encircles the aperture 136 in which the through-via 150 will be formed in some embodiments, for example.

The terminal 124 is illustrated as circular in FIGS. 7 and 8: the terminal 124 may also comprise other shapes, such as oval, square, rectangular, or other shapes. A portion of the conductive feature 108a and a portion of the conductive feature 108b are visible in the top view of the semiconductor device 100 in some embodiments.

Figure 10:
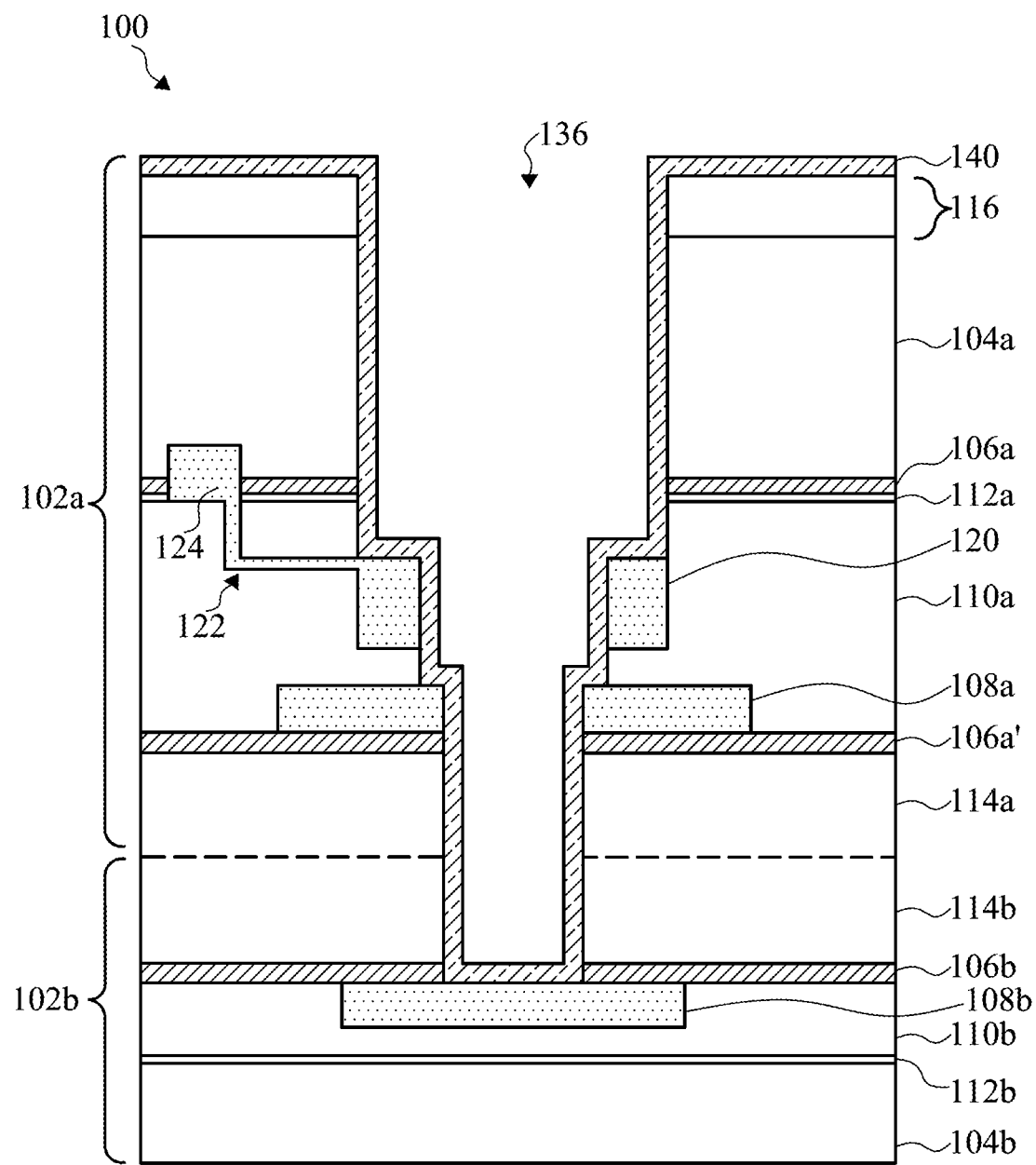

Referring next to FIG. 10, a liner 140 is formed over the semiconductor device 100, lining the aperture 136 and a top surface of the insulating material 116. The liner 140 comprises an oxide material such as $SiO_2$ or other insulating materials that is formed using CVD in some embodiments. The liner 140 comprises a thickness of about 0.05 μm to about 0.5 μm in some embodiments, for example. The liner 140 may also comprise other materials, formation methods, and dimensions. The liner 140 may be substantially conformal and have substantially the same topography as the topography of the underlying patterned material layers in some embodiments, as illustrated in FIG. 10. The liner 140 may also be non-conformal, not shown.

Figure 11:
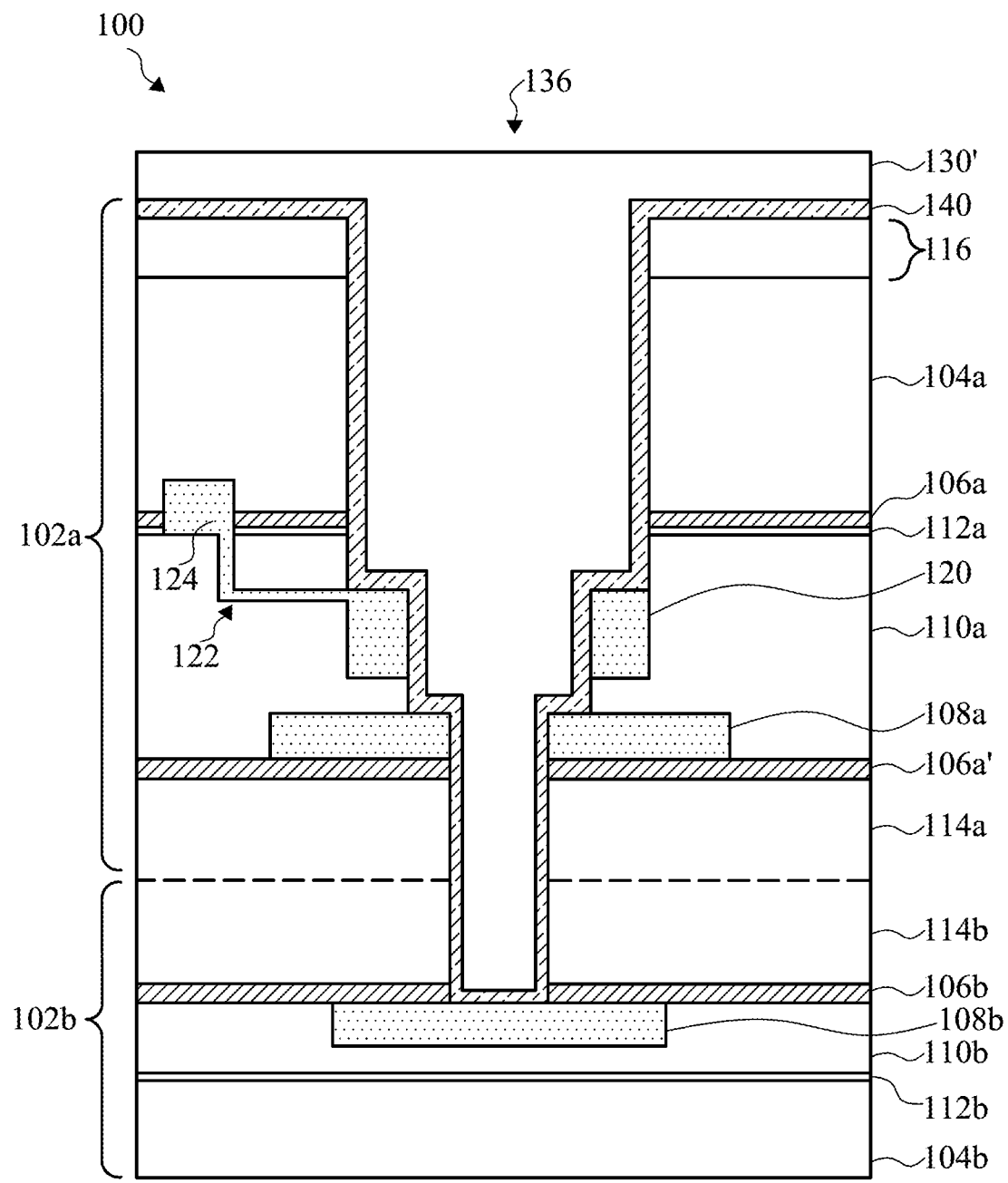
Figure 12:
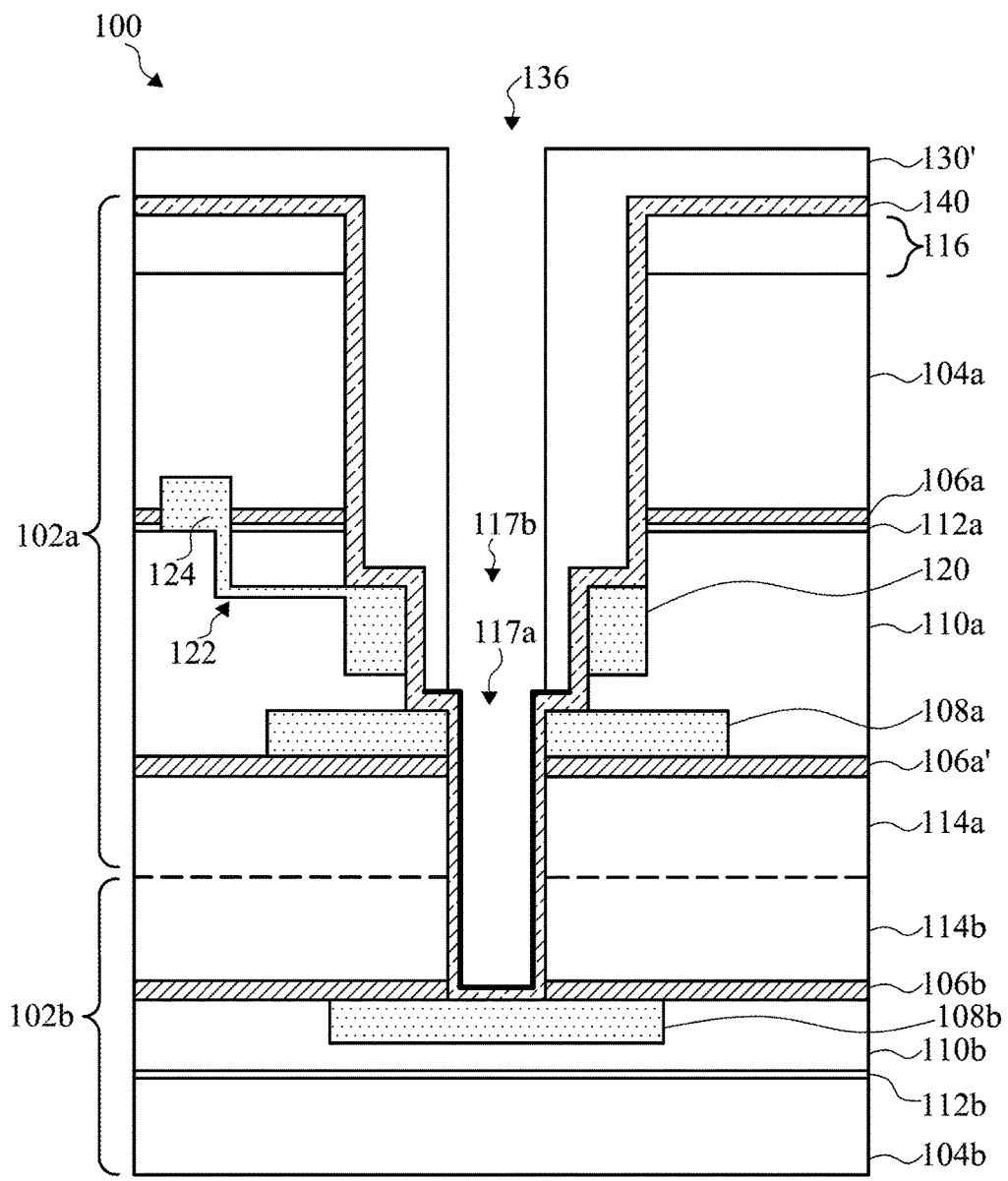

The liner 140 is removed from a lower portion of the aperture 136 in the semiconductor device 100, as shown in FIGS. 11 through 14. In FIG. 11, a second layer of photoresist 130' is formed over the semiconductor device 100. The second layer of photoresist 130' fills the aperture 136 over the liner 140 and extends over the top surface of the insulating material 116. The second layer of photoresist 130' is patterned using a photolithography process, as shown in FIG. 12. The pattern in the second layer of photoresist 130' may be substantially the same as the shape of the opening 117a in the conductive feature 108a in some embodiments. The pattern in the second layer of photoresist 130' may be slightly larger than the opening 117a in the conductive feature 108a in some embodiments. The second layer of photoresist 130' is left remaining on sidewalls of the opening 117b in the conductive shield 120 in some embodiments.

Figure 13:
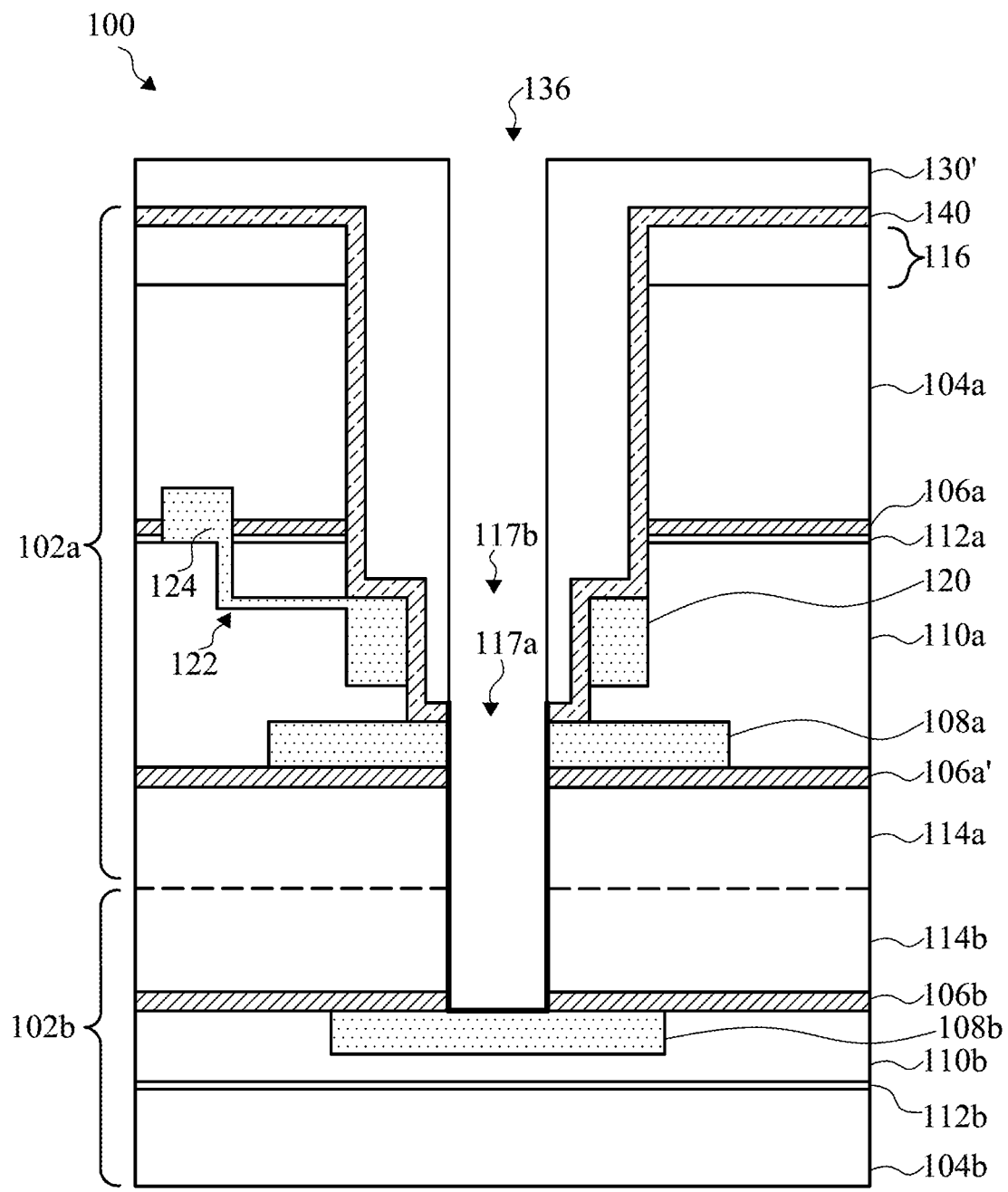
Figure 14:
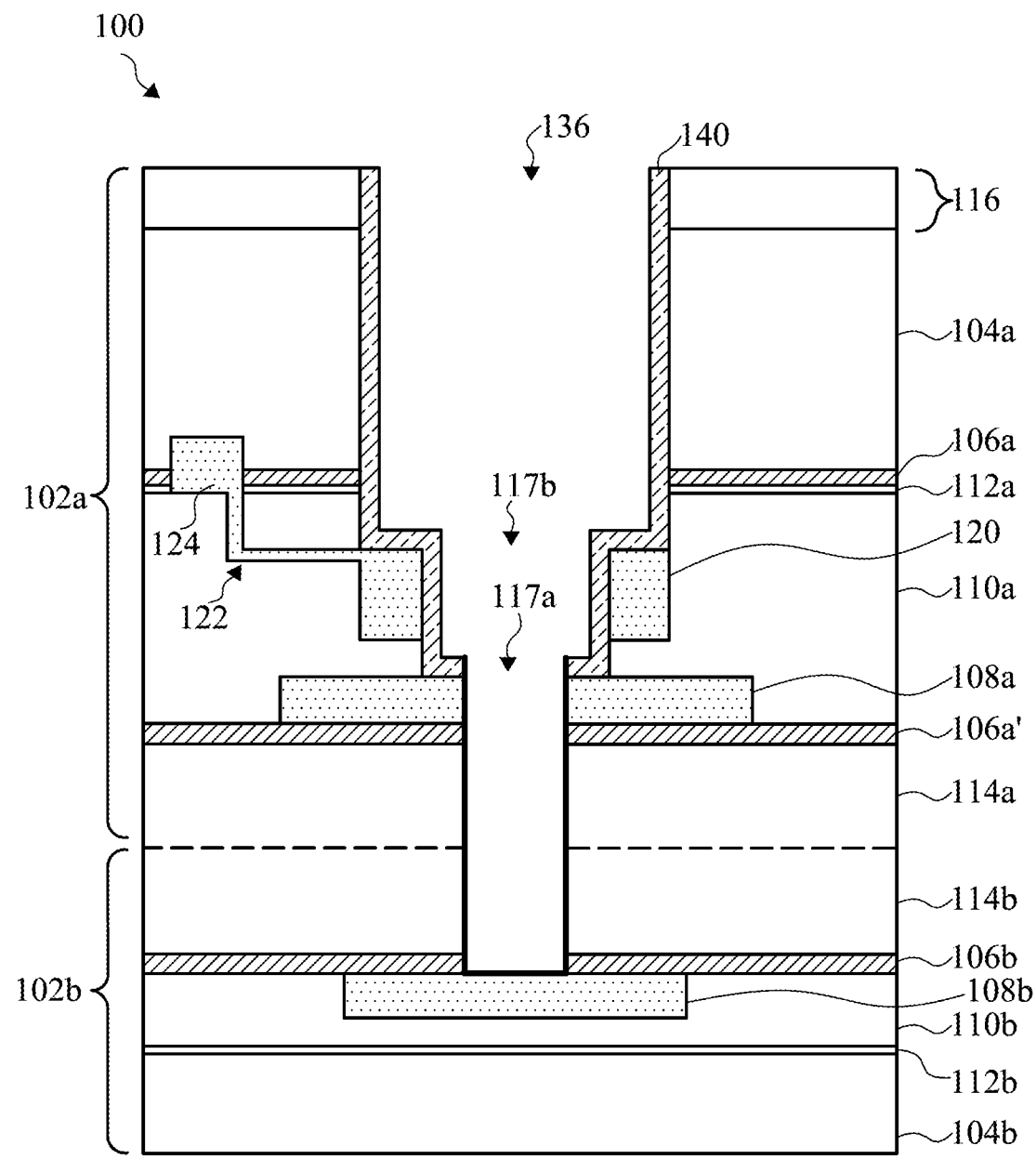

The second layer of photoresist 130' is then used as an etch mask during an etch process for the liner 140, as illustrated in FIG. 13, which removes the liner 140 from sidewalls of the opening 117a in the conductive feature 108a, sidewalls of the insulating material layers 114a and 114b, sidewalls of the passivation layers 106a' and 106b, and the top surface of the conductive feature 108b. The second layer of photoresist 130' is removed, as shown in FIG. 14. The liner 140 is left remaining on sidewalls of the opening 117b in the conductive shield 120 and upper portions of the aperture 136 above the conductive shield 120. The liner 140 is also left remaining on sidewalls of the insulating material layers 110a above the conductive feature 108a.

Figure 15:
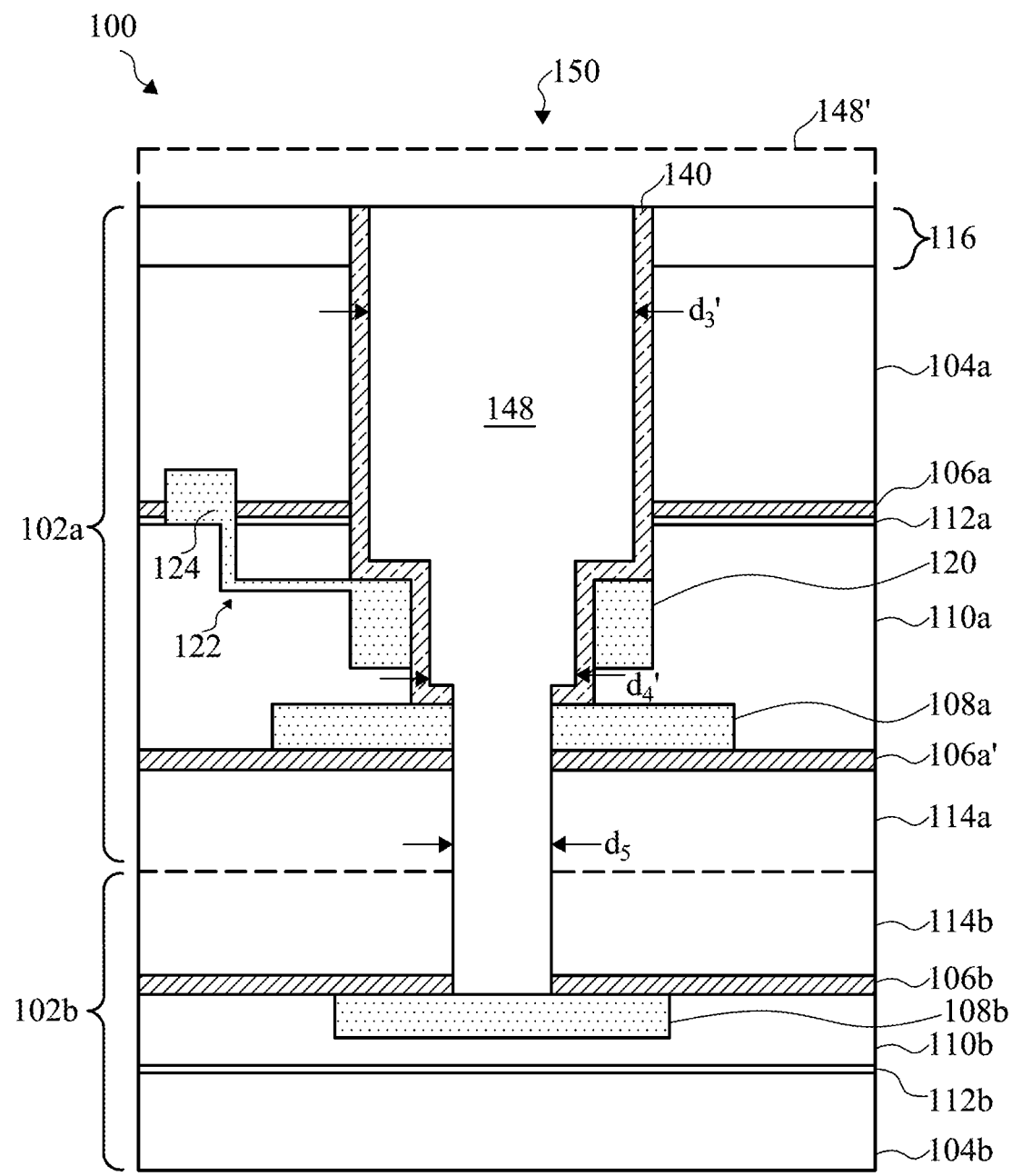

A conductive material 148 is deposited or formed over the semiconductor device 100, filling the aperture 136 and forming a conductive through-via 150, as illustrated in the cross-sectional view shown in FIG. 15. The conductive material 148 may be formed using atomic layer deposition (ALD) or electrochemical plating in some embodiments. The conductive material 148 may also be formed using other methods. The conductive material 148 may comprise copper, a copper alloy, or other metals or conductive materials, as examples.

As-deposited, the conductive material 148 may extend over a top surface of the semiconductor device 100, over the insulating material 116, as shown in phantom at 148'. Excess portions of the conductive material 148 may be removed from over the top surface of the semiconductor device 100 using a planarization process, such as a chemical-mechanical polishing (CMP) process, grinding process, etch process, or combinations thereof. A portion of the insulating material 116 and/or the substrate 104a may also be removed during the planarization process to remove the excess conductive material 148 in some embodiments. In some embodiments, a portion of the insulating material 116 and/or the substrate 104a may not be removed during the planarization process to remove the excess conductive material 148.

Thus, a through-via 150 is formed that provides a vertical electrical connection between the conductive feature 108a of the first semiconductor device 102a and the conductive feature 108b of the second semiconductor device 102b. The conductive shield 120 is electrically isolated from the through-via 150 by the liner 140 and at least partially encircles the through-via 150. The through-via 150 comprises an upper portion having a width comprising dimension $d_3'$ within insulating material 116, the substrate 104a, the passivation layer 106a, device layers of the circuitry 112a, and the insulating material layers 110a of the first semiconductor device 102a above the conductive shield 120, wherein dimension $d_3'$ comprises dimension $d_3$ shown in FIG. 6 less twice the thickness of the liner 140. The through-via 150 comprises a middle portion having a width comprising dimension $d_4'$ within the opening 117b of the conductive shield 120 and the insulating material layers 110a below the conductive shield 120 and above the conductive feature 108a, wherein dimension $d_4'$ comprises dimension $d_4$ shown in FIG. 6 less twice the thickness of the liner 140. The through-via 150 comprises a lower portion having a width comprising dimension $d_5$ within the insulating material layers 114a and 114b and passivation layers 106a' and 106b.

The through-via 150 extends through the opening 117b (see FIG. 14) in the conductive shield 120. The through-via 150 also extends through the opening 117a in the conductive feature 108a. The through-via 150 terminates at the bottom at the top surface of the conductive feature 108b. Forming the aperture 136 comprises forming an aperture 136 wherein a bottom of the aperture 136 is disposed on a surface of the conductive feature 108b; thus, the bottom of the through-via 150 is adjacent the top surface of the conductive feature 108b, for example. The electrical connection between the conductive feature 108a and conductive feature 108b is made by the through-via 150 being coupled to the top surface of the conductive feature 108b and sidewalls of the conductive feature 108a. Electrical connections may be made to the semiconductor device 100 by contacting the top surface of the through-via 150, such as by coupling connectors such as solder balls, or by forming wiring over the top surface of the semiconductor device 100, as examples.

Figure 16:
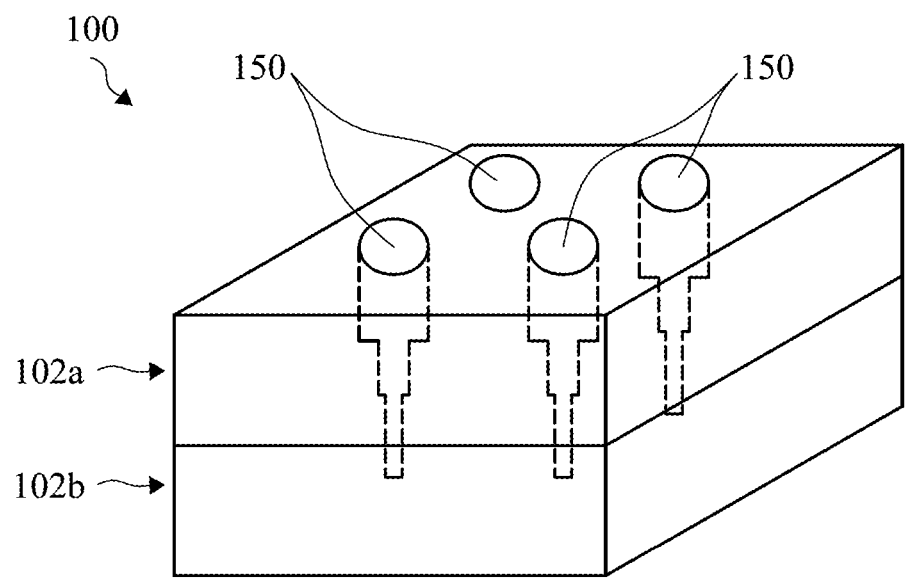
FIGS. 16 through 18 are perspective views of bonded semiconductor devices in accordance with some embodiments.
Figure 17:
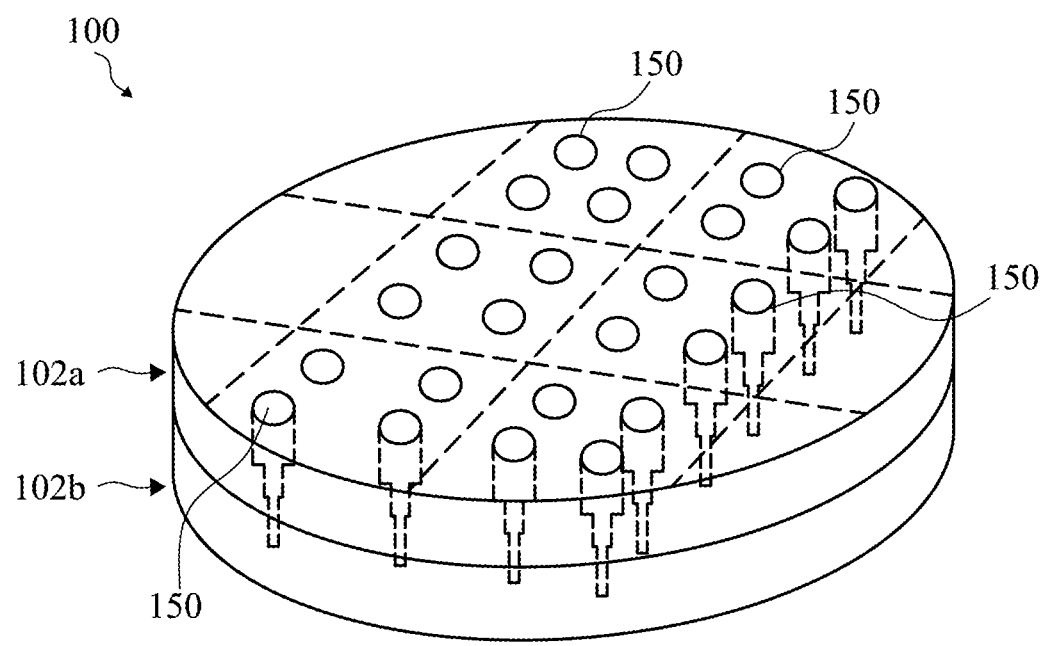
Figure 18:
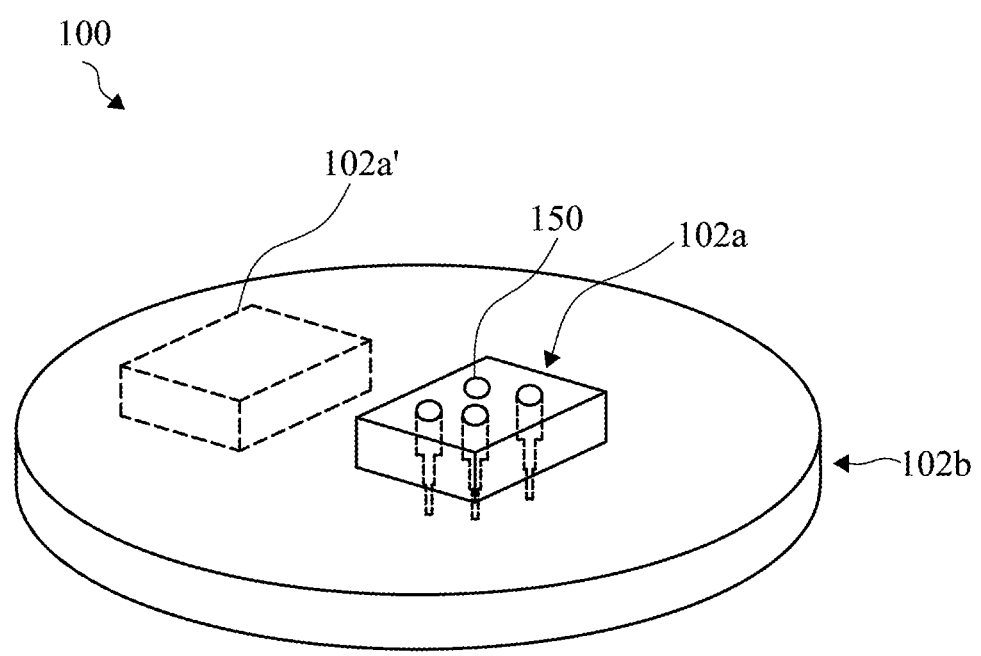

FIGS. 16 through 18 are perspective views of semiconductor devices 100 in accordance with some embodiments. In FIG. 16, a first semiconductor device 102a coupled to a second semiconductor device 102b is shown, wherein the first semiconductor device 102a and second semiconductor device 102b comprise integrated circuit dies. A plurality of the through-vias 150 described herein are formed on the semiconductor device 100. One or more of the plurality of through-vias 150 may include a conductive shield 120 (not shown in FIG. 16; see FIG. 15) disposed around a portion of the through-vias 150 in accordance with some embodiments of the present disclosure.

FIG. 17 illustrates some embodiments wherein the first semiconductor device 102a and second semiconductor device 102b comprise wafers that include a plurality of integrated circuit dies. In FIG. 18, the first semiconductor device 102a comprises an integrated circuit die, and the second semiconductor device 102b comprises a wafer. A plurality of first semiconductor devices 102a comprising integrated circuit dies may be bonded to a semiconductor device 102b comprising a wafer in some embodiments, as shown at 102a and in phantom at 102a'. Likewise, one or more second semiconductor devices 102b may be bonded to a first semiconductor device 102a comprising a wafer in some embodiments, not shown. One or more of the plurality of through-vias 150 may include a conductive shield 120 disposed around a portion of the through-vias 150 in the configurations illustrated in FIGS. 17 and 18, in accordance with some embodiments.

FIGS. 16 through 18 also illustrate a plurality of through-vias 150 being formed between the first semiconductor devices 102a and the second semiconductor devices 102b. In some embodiments, a first semiconductor device 102a may comprise a plurality of first conductive features 108a, and the second semiconductor device 102b may comprise a plurality of second conductive features 108b. An aperture 136 may be formed between each of the plurality of first conductive features 108a and one of the plurality of second conductive features 108b in some embodiments. The apertures 136 are filled with the conductive material 148 to form a plurality of through-vias 150.

Figure 19:
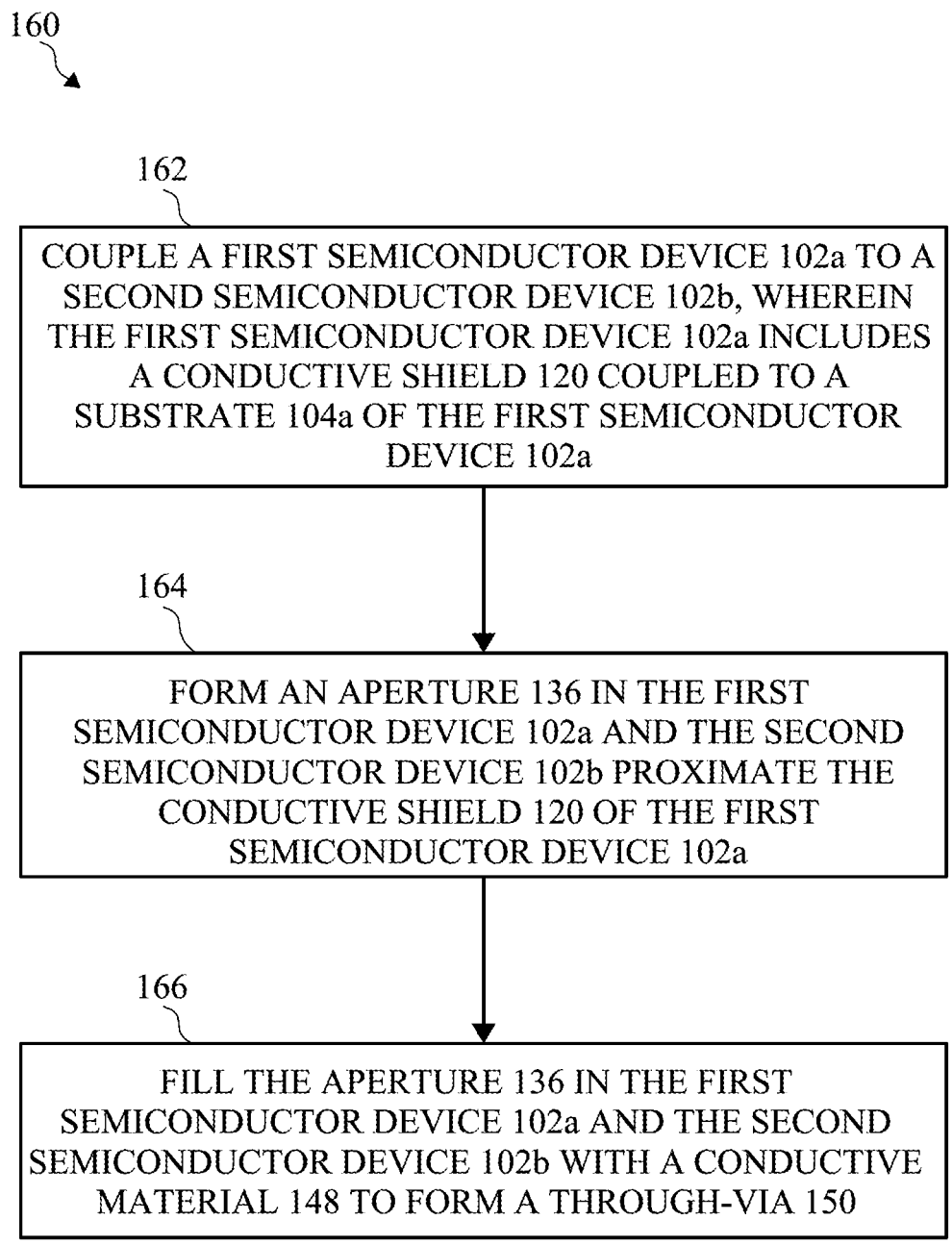
FIG. 19 is a flow chart that illustrates a manufacturing method for a semiconductor device in accordance with some embodiments of the present disclosure.

FIG. 19 is a flow chart 160 that illustrates a manufacturing method for a semiconductor device 100 in accordance with some embodiments of the present disclosure. In step 162 of the flow chart 160, a first semiconductor device 102a is coupled to a second semiconductor device 102b, wherein the first semiconductor device 102a includes a conductive shield 120 coupled to a substrate 104a of the first semiconductor device 102a (see also FIG. 3). In step 164, an aperture 136 is formed in the first semiconductor device 102a and the second semiconductor device 102b proximate the conductive shield 102 of the first semiconductor device 102a (see also FIGS. 4 through 7). In step 166, the aperture 136 in the first semiconductor device 102a and the second semiconductor device 102b is filled with a conductive material 148 to form a through-via 150 (see also FIG. 15).

Some embodiments of the present disclosure include semiconductor devices 100 that include through-vias 150 that are shielded by a conductive shield 120 as described herein. Some embodiments of the present disclosure include methods of manufacturing the semiconductor devices 100 that include the shielded through-vias 150 described herein.

Some advantages of some embodiments of the present disclosure include providing semiconductor devices and 3DICs with improved yields. The conductive shield proximate the through-vias provides a conductive shielding which reduces a PID effect in the formation of the through-vias. The conductive shield provides an electrically conductive path which removes charge accumulation during a plasma etch process used to form apertures for the through-vias in some embodiments, for example. The conductive shield reduces or prevents PID during a plasma etch process used to form the aperture for the through-vias in some embodiments. The conductive shield provides a grounding electrical path to the substrate and provides ESD protection in some embodiments. The conductive shield may advantageously be formed in existing material layers of an interconnect structure of a first semiconductor device, such as conductive line layers or conductive via layers, so that additional material layers are not required. The conductive shield may also be formed when forming existing material layers of an interconnect structure of a first semiconductor device, so that no additional manufacturing steps are required to form the conductive shield.

The liner within an upper portion of the through-via provides insulating between the through-vias and the conductive shields. Some embodiments may be implemented in wafer-to-wafer, chip-to-chip, and chip-to-wafer bonding. Furthermore, the methods and devices described herein are easily implementable into existing semiconductor device manufacturing and/or packaging process flows and structures.

In some embodiments, a semiconductor device includes a first integrated circuit die, a second integrated circuit die coupled to the first integrated circuit die, and a through-via coupled between a first conductive feature of the first integrated circuit die and second conductive feature of the second integrated circuit die. A conductive shield is disposed around a portion of the through-via.

In some embodiments, a method of manufacturing a device includes coupling a first semiconductor device to a second semiconductor device, wherein the first semiconductor device includes a conductive shield coupled to a substrate of the first semiconductor device. An aperture is formed in the first semiconductor device and the second semiconductor device proximate the conductive shield of the first semiconductor device. The aperture in the first semiconductor device and the second semiconductor device is filled with a conductive material to form a through-via.

In some embodiments, a method of manufacturing a device includes coupling a first semiconductor device to a second semiconductor device. The first semiconductor device includes a first substrate, a first conductive feature disposed over the first substrate, a first insulating material layer disposed over the first conductive feature, and a conductive shield coupled to the first substrate proximate the first conductive feature. The second semiconductor device includes a second substrate, a second conductive feature disposed over the second substrate, and a second insulating material layer disposed over the second conductive feature. Coupling the first semiconductor device to the second semiconductor device comprises coupling the second insulating material layer to the first insulating material layer. The method includes forming an aperture in the first semiconductor device and a portion of the second semiconductor device, forming a liner in the aperture, and removing a portion of the liner. The aperture in the first semiconductor device and the second semiconductor device is filled with a conductive material to form a through-via coupled between the first conductive feature and the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, the method comprising:

coupling a first semiconductor device to a second semiconductor device, wherein the first semiconductor device includes a conductive shield;

forming an aperture in the first semiconductor device and the second semiconductor device, wherein the aperture exposes a sidewall of the conductive shield;

lining the aperture with a dielectric material, wherein a first portion of the dielectric material is disposed laterally adjacent and on the sidewall of the conductive shield; and filling the aperture with a conductive material to form a through-via.

2. The method according to claim 1, wherein coupling the first semiconductor device to the second semiconductor device comprises coupling a first semiconductor device comprising a wafer, an integrated circuit die, or a plurality of integrated circuit dies to the second semiconductor device.

3. The method according to claim 1, wherein coupling the first semiconductor device to the second semiconductor device comprises coupling the first semiconductor device to a second semiconductor device comprising a wafer, an integrated circuit die, or a plurality of integrated circuit dies.

4. The method according to claim 1, wherein the first semiconductor device comprises a first insulating material layer disposed thereon, wherein the second semiconductor device comprises a second insulating material layer disposed thereon, and wherein coupling the first semiconductor device to the second semiconductor device comprises coupling the first insulating material layer of the first semiconductor device to the second insulating material layer of the second semiconductor device.

5. The method according to claim 4, wherein at least one of the first insulating material layer or the second insulating material layer comprises a buried oxide (BOX) layer.

6. The method according to claim 1, wherein the conductive shield is disposed in a conductive line layer or a conductive via layer of the first semiconductor device.

7. The method according to claim 1, wherein lining the aperture comprises the dielectric material comprising an oxide material.

8. The method according to claim 1, wherein a second portion of the dielectric material is disposed over and on an uppermost surface of the conductive shield.

9. A method of manufacturing a device, the method comprising:

coupling a first semiconductor device to a second semiconductor device, wherein the first semiconductor device includes a first substrate, a first conductive feature disposed over the first substrate, a first insulating material layer disposed over the first conductive feature, and a conductive shield coupled to the first substrate proximate the first conductive feature, wherein the conductive shield provides a grounding electrical path to the first substrate, wherein the second semiconductor device includes a second substrate, a second conductive feature disposed over the second substrate, and a second insulating material layer disposed over the second conductive feature, wherein coupling the first semiconductor device to the second semiconductor device comprises coupling the second insulating material layer to the first insulating material layer;

forming an aperture in the first semiconductor device and a portion of the second semiconductor device;

forming a liner in the aperture;

removing a portion of the liner, wherein removing the portion of the liner exposes at least a portion of a surface of the first conductive feature and at least a portion of a surface of the second conductive feature; and filling the aperture with a conductive material to form a through-via coupled between the first conductive feature and the second conductive feature.

10. The method according to claim 9, wherein the conductive shield comprises a first opening, and wherein the through-via extends through the first opening.

11. The method according to claim 10, wherein the first conductive feature comprises a second opening, and wherein the through-via extends through the second opening.

12. The method according to claim 11, wherein forming the aperture comprises forming an aperture wherein a bottom of the aperture is disposed on the surface of the second conductive feature.

13. The method according to claim 9, wherein the first semiconductor device comprises a plurality of first conductive features, and the second semiconductor device comprises a plurality of second conductive features, and further comprising forming respective apertures between each of the plurality of first conductive features and one of the plurality of second conductive features, and filling the respective apertures with the conductive material.

14. The method according to claim 9, wherein forming the aperture comprises a plasma etch process, and wherein the conductive shield provides electrostatic discharge (ESD) protection during the plasma etch process.

15. A method of manufacturing a device, the method comprising:
    coupling a first semiconductor device to a second semiconductor device, wherein the first semiconductor device includes a first substrate, a first conductive feature disposed over the first substrate, a first insulating material layer disposed over the first conductive feature, and an annular conductive shield coupled to the first substrate proximate the first conductive feature, wherein the second semiconductor device includes a second substrate, a second conductive feature disposed over the second substrate, and a second insulating material layer disposed over the second conductive feature;

forming an aperture in the first semiconductor device and a portion of the second semiconductor device, the aperture passing through an opening in the annular conductive shield, the aperture exposing a sidewall of the annular conductive shield;

forming a liner in the aperture;

removing a portion of the liner; and filling the aperture in the first semiconductor device and the second semiconductor device with a conductive material to form a through-via coupled between the first conductive feature and the second conductive feature, wherein a third insulating material is on and interposed between the sidewall of the annular conductive shield and a laterally adjacent portion of the through-via.

16. The method according to claim 15, wherein coupling the first semiconductor device to the second semiconductor device comprises coupling a first semiconductor device comprising a wafer, an integrated circuit die, or a plurality of integrated circuit dies to the second semiconductor device.

17. The method according to claim 15, wherein coupling the first semiconductor device to the second semiconductor device comprises coupling the first semiconductor device to a second semiconductor device comprising a wafer, an integrated circuit die, or a plurality of integrated circuit dies.

18. The method according to claim 15, wherein coupling the first semiconductor device to the second semiconductor device comprises coupling the first insulating material layer of the first semiconductor device to the second insulating material layer of the second semiconductor device.

19. The method according to claim 15, wherein at least one of the first insulating material layer or the second insulating material layer comprises a buried oxide (BOX) layer.

20. The method according to claim 15, wherein the aperture passes through an opening in the first conductive feature.

* * * * *